(12) United States Patent
Tomita et al.

(10) Patent No.: US 10,997,961 B2
(45) Date of Patent: May 4, 2021

(54) ACOUSTIC LENS AND PRODUCTION METHOD THEREOF, AND ACOUSTIC WAVE PROBE

(71) Applicants: NISSHINBO HOLDINGS INC., Tokyo (JP); UEDA JAPAN RADIO CO., LTD., Ueda (JP)

(72) Inventors: Hideshi Tomita, Chiba (JP); Takashi Suzuki, Okazaki (JP); Shigeo Kobayashi, Ueda (JP)

(73) Assignees: NISSHINBO HOLDINGS INC., Tokyo (JP); UEDA JAPAN RADIO CO., LTD., Nagano (JP)

( * ) Notice: Subject to any disclaimer, the term of this patent is extended or adjusted under 35 U.S.C. 154(b) by 167 days.

(21) Appl. No.: 16/469,038

(22) PCT Filed: Dec. 11, 2018

(86) PCT No.: PCT/JP2018/045543
§ 371 (c)(1),
(2) Date: Jun. 12, 2019

(87) PCT Pub. No.: WO2019/142547
PCT Pub. Date: Jul. 25, 2019

(65) Prior Publication Data
US 2021/0097971 A1    Apr. 1, 2021

(30) Foreign Application Priority Data
Jan. 17, 2018    (JP) .............................. JP2018-005885

(51) Int. Cl.
*G10K 11/30*    (2006.01)
*H03H 9/145*    (2006.01)
*H03H 9/25*    (2006.01)

(52) U.S. Cl.
CPC ............. *G10K 11/30* (2013.01); *H03H 9/145* (2013.01); *H03H 9/25* (2013.01)

(58) Field of Classification Search
CPC .......... G10K 11/30; H03H 9/145; H03H 9/25
See application file for complete search history.

(56) References Cited

U.S. PATENT DOCUMENTS

| 6,418,084 B2 * | 7/2002 | Saito ...................... G10K 11/30 |
| | | 367/150 |
| 2005/0070801 A1 | 3/2005 | Yamashita et al. |

(Continued)

FOREIGN PATENT DOCUMENTS

| JP | 2005-125071 A | 5/2005 |
| JP | 2009-72605 A | 4/2009 |

(Continued)

OTHER PUBLICATIONS

International Search Report for PCT/JP2018/045543 dated Mar. 5, 2019.

(Continued)

*Primary Examiner* — J. San Martin
(74) *Attorney, Agent, or Firm* — Birch, Stewart, Kolasch & Birch, LLP

(57) ABSTRACT

The present invention is aimed to provide, as an acoustic lens propagating a sonic wave having a wavelength λ of 100 µm or less, an acoustic lens capable of exhibiting excellent acoustic characteristics in response to the wavelength λ of the sonic wave to be propagated and a production method thereof. The acoustic lens is an acoustic lens 1 to be used for propagating a sonic wave having a wavelength λ of 100 µm or less, wherein the acoustic lens contains a silicone resin and silica particles, an average primary particle diameter of the silica particles is 15 nm or more, and a particle diameter (D90) of 90% of a cumulative percentage in cumulative (Continued)

particle size distribution of the silica particles is less than ⅛ of the wavelength $\lambda$ of the sonic wave to be propagated.

5 Claims, 1 Drawing Sheet

(56) References Cited

U.S. PATENT DOCUMENTS

| | | |
|---|---|---|
| 2009/0069486 A1 | 3/2009 | Yamashita et al. |
| 2015/0011881 A1 | 1/2015 | Okuda |
| 2016/0051228 A1 | 2/2016 | Nakai et al. |
| 2017/0258442 A1 | 9/2017 | Yoshida et al. |
| 2017/0335108 A1* | 11/2017 | Morita ................. C08L 83/04 |
| 2018/0344287 A1 | 12/2018 | Nakai et al. |

FOREIGN PATENT DOCUMENTS

| | | |
|---|---|---|
| JP | 2012-34160 A | 2/2012 |
| JP | 2015-12943 A | 1/2015 |
| JP | 2016-46811 A | 4/2016 |
| JP | 2017-163331 A | 9/2017 |
| WO | WO 2017/130890 A1 | 8/2017 |

OTHER PUBLICATIONS

Written Opinion of the International Searching Authority for PCT/JP2018/045543 dated Mar. 5, 2019.
Extended European Search Report for European Application No. 18884839.4, dated Jan. 7, 2020.

* cited by examiner

[Fig. 1]
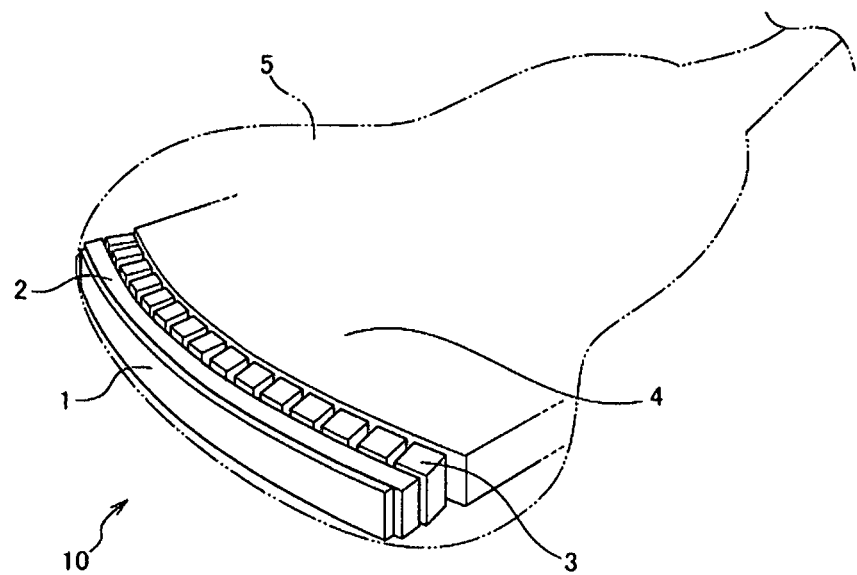
[Fig. 2]
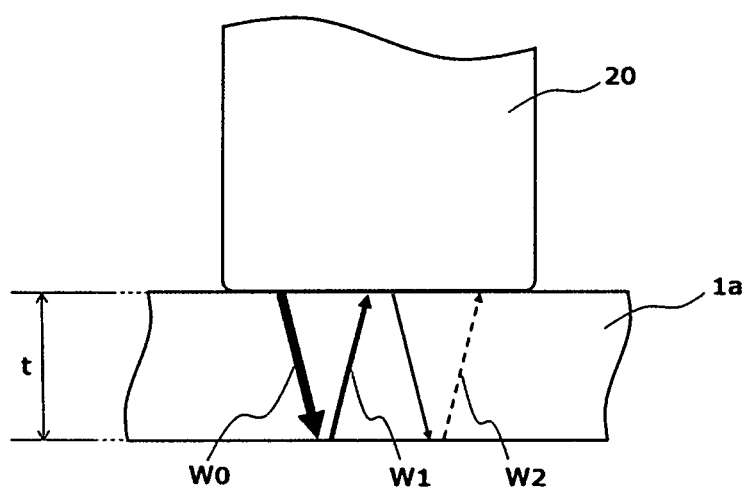

ACOUSTIC LENS AND PRODUCTION METHOD THEREOF, AND ACOUSTIC WAVE PROBE

TECHNICAL FIELD

The present invention relates to an acoustic lens and a production method thereof, and an acoustic wave probe equipped with the acoustic lens of the present invention.

BACKGROUND ART

In general, in an ultrasound diagnosis, an ultrasonic wave is propagated into the interior of an object (living body) to receive an echo thereof, and a variety of diagnostic information inclusive of a tomographic image of the object on a basis of echo-receiving signals is acquired.

In such an ultrasound diagnosis, transmission and reception of an ultrasonic wave is performed through an acoustic wave probe. The acoustic wave probe is provided with a piezoelectric element (transducer) bearing electro-acoustic conversion. Furthermore, when viewed from the piezoelectric element, the acoustic wave probe is provided with an acoustic matching layer and an acoustic lens in order on the side of an ultrasonic wave transmitting and receiving surface (side of an object) and a backing material on the side of a rear surface (side of a power source), respectively.

In such an acoustic wave probe, the acoustic lens is provided for the purpose of focusing ultrasonic waves to be radiated to the living body, to obtain a high-intensity beam. As characteristics required for such an acoustic lens, there are exemplified that (i) it has an acoustic impedance (density×acoustic velocity) close to that of the living body; (ii) a propagation velocity of the ultrasonic wave is slower than 1,500 m/s as a propagation velocity of the living body; (iii) an attenuation of sonic vibration is low; and (iv) it has appropriate strength and is excellent in wear resistance.

For materials for such an acoustic lens, a silicone resin having an acoustic impedance close to that of the living body ($1.4 \times 10^6$ to $1.7 \times 10^6$ kg/m²/s) and a low ultrasonic attenuation quantity has been mainly used. But, an acoustic lens constituted of only a silicone resin is inferior especially in the strength and wear resistance, and therefore, it was general to add a filler, such as a metal and an oxide.

Meanwhile, the addition of a filler became a cause of the attenuation of sonic vibration and was also a factor of worsening acoustic characteristics of the acoustic lens. For that reason, investigations regarding a particle diameter or composition of the filler, and so on have also been made recently. For example, PTL 1 proposes a technique in which by using silica of a nano particle size, the hardness and mechanical strength of the obtained silicone resin are improved while keeping an attenuation quantity of sonic vibration low. In addition, PTL 2 proposes a technique in which in order to make the acoustic impedance of the acoustic lens close to that of the living body, by using zinc oxide or ytterbium oxide having a density larger than silica is used, the attenuation of sonic vibration is reduced.

However, even the aforementioned techniques could not satisfactorily response to requirements for more improvements of acoustic characteristics in recent years. In particular, there is a tendency that the higher the frequency of a sonic wave to be propagated, the larger the attenuation quantity of sonic vibration, and therefore, for example, in an acoustic lens which is used upon radiation of a sonic wave having a high frequency of 10 MHz or more, it was very difficult to improve its acoustic characteristics.

In addition, in the conventional development of acoustic lenses, special construction of a theory regarding the acoustic characteristics in response to the frequency of a sonic wave to be radiated was not made, and a trial-and-error method of actually fabricating a material and evaluating it was repeated. Such a development method required a lot of time, labor and cost until realizing an acoustic lens having favorable acoustic characteristics, and involved such a problem that they are wasteful.

CITATION LIST

Patent Literature

PTL 1: JP 2016-046811 A
PTL 2: JP 2005-125071 A

SUMMARY OF INVENTION

Technical Problem

Then, the present invention is aimed to solve the aforementioned conventional problems and to provide, as an acoustic lens to be used for propagating a sonic wave having a wavelength $\lambda$ of 100 µM or less, an acoustic lens capable of exhibiting excellent acoustic characteristics in response to the wavelength $\lambda$ of the sonic wave to be propagated and a production method thereof, and an acoustic wave probe equipped with the acoustic lens of the present invention.

Solution to Problem

The present inventors made extensive and intensive investigations. As a result, it has been found that in an acoustic lens to be used for propagating a sonic wave having a wavelength $\lambda$ of 100 µm or less, when the acoustic lens contains a silicone resin and silica particles, an average primary particle diameter of the silica particles is 15 nm or more, and a particle diameter (D90) of 90% of a cumulative percentage in cumulative particle size distribution of the silica particles is less than ⅛ of the wavelength $\lambda$ of the sonic wave to be propagated, excellent acoustic characteristics in response to the wavelength $\lambda$ of the sonic waves to be propagated are exhibited, thereby leading to accomplishment of the present invention.

Specifically, the gist and constitution of the present invention are as follows.

[1] An acoustic lens to be used for propagating a sonic wave having a wavelength $\lambda$ of 100 µm or less, wherein the acoustic lens contains a silicone resin and silica particles, an average primary particle diameter of the silica particles is 15 nm or more, and a particle diameter (D90) of 90% of a cumulative percentage in cumulative particle size distribution of the silica particles is less than ⅛ of the wavelength $\lambda$ of the sonic wave to be propagated.

[2] The acoustic lens as set forth in the above [1], which has a hardness, as measured by a type A durometer in conformity with JIS K6253-3:2012, of 30 or more and 50 or less.

[3] An acoustic wave probe equipped with the acoustic lens as set forth in the above [1] or [2].

[4] A production method of an acoustic lens to be used for propagating a sonic wave having a wavelength $\lambda$ of 100 µm or less, the method including a step of obtaining a silicone resin composition containing an addition reaction type liquid silicone resin having a viscosity of less than 3.5 Pa·s and silica particles; and a step of curing the silicone resin composition, wherein an average primary particle diameter of the silica particles is 15 nm or more, and a particle diameter (D90) of 90% of a cumulative percentage in cumulative particle size distribution of the silica particles is less than ⅛ of the wavelength λ, of the sonic wave to be propagated.

[5] The production method of an acoustic lens as set forth in the above [4], further including a step of subjecting the silicone resin composition to a defoaming treatment prior to curing.

Advantageous Effects of Invention

In accordance with the present invention, it is possible to provide an acoustic lens to be used for propagating a sonic wave having a wavelength λ of 100 μm or less, which is able to exhibit excellent acoustic characteristics in response to the wavelength λ of the sonic wave to be propagated, and a production method thereof, and an acoustic wave probe equipped with the acoustic lens of the present invention.

BRIEF DESCRIPTION OF DRAWINGS

FIG. 1 is a diagrammatic perspective view showing a representative constitution of an acoustic wave probe.

FIG. 2 is a view for explaining an evaluation method of an acoustic lens.

DESCRIPTION OF EMBODIMENTS

The acoustic lens and the production method thereof according to the present invention are hereunder described in detail.

[Acoustic Lens]

The acoustic lens of the present invention is one to be used for propagating a sonic wave having a wavelength λ of 100 μm or less, wherein the acoustic lens contains a silicone resin and silica particles, an average primary particle diameter of the silica particles is 15 nm or more, and a particle diameter of 90% of a cumulative percentage (hereinafter referred to simply as "D90") in cumulative particle size distribution of the silica particles is less than ⅛ of the wavelength λ of the sonic wave to be propagated.

In view of the fact that in particular, the acoustic lens of the present invention contains silica particles having a particle diameter in response to the wavelength λ of the sonic wave to be propagated, excellent acoustic characteristics are exhibited. Such an acoustic lens of the present invention is, for example, suitable as an acoustic lens to be used upon radiation of a sonic wave having a frequency of 10 MHz or more.

In the conventional development of acoustic lenses, a trial-and-error method was general; however, according to the present invention, an acoustic lens having favorable acoustic characteristics can be fabricated as intended in response to the frequency of the sonic wave to be radiated. For that reason, uselessness regarding the time, labor and cost required for the development can be minimized.

The acoustic lens of the present invention contains a silicone resin and silica particles having a predetermined particle diameter. In addition, the acoustic lens of the present invention may further contain, as other components, a component other than the silicone resin and the silica particles within a range where the effects of the present invention are not hindered. Each of the constituent components is hereunder described in detail.

(Silicone Resin)

Though the silicone resin is not particularly limited, examples thereof include dimethyl silicone, methylphenyl silicone, phenyl silicone, and modified silicone. Above all, dimethyl silicone and methylphenyl silicone are preferred. Specifically, the silicone resin is preferably a cured product of an addition reaction type liquid silicone resin as mentioned later. Here, the addition reaction type liquid silicone resin includes a one-pack type and a two-pack mixing type, and in the case where the addition reaction type liquid silicone resin is of a two-pack mixing type, a cured product thereof indicates the whole of a material obtained through curing of the two-liquid mixture.

In the following description, in the case of referring to simply as "silicone resin", a silicone resin as the aforementioned cured product is indicated, whereas in the case of referring to as "liquid silicone resin", an uncured silicone resin as a raw material as in the aforementioned addition reaction type liquid silicone resin is indicated. That is, the "liquid silicone resin" is a precursor of the silicone resin as a cured product.

(Silica Particles)

The silica particles play a role as a filler. The filler is a component which is added for the purposes of improving the strength and wear resistance of the acoustic lens and regulating the density as the acoustic lens. However, the addition of the filler becomes a factor of including a particle interface serving as a generation source of irregular reflection of a sonic wave into the interior of the acoustic lens. For that reason, even if it would be needed to add the filler for the purposes of improving the strength and regulating the density, there was involved such a problem that the sonic wave to be transmitted reflects on the particle interface to be included, and the sonic vibration is attenuated, thereby bringing about worsening in acoustic characteristics.

In order to solve the aforementioned problem, the present inventors made extensive and intensive investigations. As a result, it has been found that even in the case where the acoustic lens includes the particle interface in the interior thereof, so far as the particle diameter of the filler is selected in response to the frequency of the sonic wave to be radiated, the reflection of the sonic wave is hardly reflected on the particle interface.

Based on the aforementioned finding, it has been found that in the acoustic lens to be used for propagating a sonic wave having a wavelength λ of 100 μm or less, by not only regulating the average primary particle diameter of the silica particles to 15 nm or more but also regulating the D90 to less than ⅛ of the wavelength λ of the sonic wave to be propagated, the reflection of the sonic wave on the particle interface can be efficiently suppressed, thereby leading to accomplishment of the present invention. According to such present invention, it becomes possible to design, as the acoustic lens to be used for propagating a sonic wave having a wavelength λ of 100 μm or less, a composition with a high degree of freedom from the viewpoints of improving the strength and wear resistance and regulating the density, and so on, while keeping the favorable acoustic characteristics in response to the frequency of the sonic wave to be radiated.

The average primary particle diameter of the silica particles is 15 nm or more, preferably 25 nm or more, and more preferably 30 nm or more. The silica particles having such a particle diameter is good in handling properties, and for example, in the production process, it is readily kneaded with the liquid silicone resin, and the viscosity regulation of the silicone resin composition obtained from this is comparatively easy. The silicone resin composition having been regulated to an appropriate viscosity is readily defoamed, and therefore, by using such a silicone resin composition, a cured product (acoustic lens) free from foam (voids) is obtained, and the acoustic characteristics can be kept favorable.

In excessively fine silica particles, such as silica particles having an average primary particle diameter of less than 15 nm, a bulk density of the particles is low, and therefore, when added to the liquid silicone resin, a kneading work takes a lot of time. In addition, since such particles have a relatively large specific surface area, when added to the liquid silicone resin, fluidity of the liquid silicone resin is extremely worsened, thereby bringing about a remarkable increase of the viscosity of the silicone resin composition. For that reason, in excessively fine silica particles, in order to control it to a viscosity at which it is possible to achieve kneading with the liquid silicone resin in the first place, it is needed to reduce the blending amount of the silica particles as the filler.

However, even when the blending amount of the silica particles is regulated to an extent of viscosity at which they can be kneaded with the liquid silicone resin, in a cured product obtained from such a silicone resin composition, defoaming is insufficient (defoaming failure), so that there is a concern of bringing about worsening in acoustic characteristics.

Typically, when a powdery filler is blended in the liquid silicone resin, there is a case where air is incorporated together with the filler. Such air is removed on the whole in the kneading step or defoaming step; however, in the case where the viscosity of the silicone resin composition is high, there is a case where air remains in the composition. Then, when the liquid silicone resin is cured as it is, a foam (void) is formed within the cured product (acoustic lens). The thus formed void becomes a generation source of reflection of a sonic wave within the acoustic lens, and therefore, it attenuates the sonic vibration, thereby causing worsening of the acoustic characteristics. In consequence, in order to obtain an acoustic lens having excellent acoustic characteristics, it was needed to further reduce the blending amount of silica particles such that a void is not formed within the acoustic lens.

The sonic wave vibrates the silicone resin and is propagated within the acoustic lens; however, when the filler is added, the vibration of the silicone resin is suppressed owing to contact with the filler particles. As the contact surface between the particles and the silicone resin increases, such an action becomes larger, thereby bringing about attenuation of the sonic vibration. As mentioned above, the fine silica particles are large in the specific surface area as compared with silica particles having a relatively large particle diameter, and therefore, even in the same blending amount, there is a tendency that the attenuation of the sonic vibration is large, and the acoustic characteristics are deteriorated. For that reason, in order to obtain an acoustic lens having excellent acoustic characteristics, it was needed to control the blending amount of the silica particles such that the vibration of the silicone resin is not hindered as far as possible.

In this way, in the case of using fine silica particles, from the viewpoints of workability in the production and keeping and improving the acoustic characteristics, and so on, the blending amount of the silica particles had to be reduced, and it was difficult to design, as the filler, a composition with a high degree of freedom.

In the present invention, by regulating the average primary particle diameter of the silica particles to 15 nm or more, it becomes possible to design a composition with a high degree of freedom from the viewpoints of improving the strength and wear resistance and regulating the density, and so on, while keeping the favorable acoustic characteristics. Though an upper limit of the average primary particle diameter is not particularly limited so long as the D90 is restricted within a predetermined range, in relation with the D90, the average primary particle diameter of the silica particles is also less than ⅛ of the wavelength of the sonic wave to be propagated. For example, when $\lambda$ is 100 µm, such an average primary particle diameter is less than 12.5 µm.

Next, the D90 of the silica particles is less than ⅛ of the wavelength $\lambda$ of the sonic wave to be propagated. For example, when $\lambda$ is 100 µm, such D90 is less than 12.5 µm, and preferably 10 µm or less. By allowing the D90 to fall within the aforementioned range, the reflection of the sonic wave on the particle interface can be efficiently suppressed, and the acoustic characteristics can be kept favorable.

In the conventional development of acoustic lenses, a relation of the acoustic characteristics with the frequency of a sonic wave to be radiated to the acoustic lens is not sufficiently investigated, the acoustic lens having favorable acoustic characteristics had to be fabricated merely through a trial-and-error method.

However, according to the aforementioned constitution of the present invention, by selecting the particle size of the silica particles in response to the frequency of the sonic wave to be radiated, it becomes possible to efficiently fabricate an acoustic lens having excellent acoustic characteristics.

The wavelength $\lambda$ of the sonic wave which propagates within the acoustic lens can be expressed according to a relation of the following formula (1) on a basis of a frequency f of the sonic wave to be radiated to the acoustic lens and an acoustic velocity v in a medium (mainly a silicone resin).

$$\lambda = v/f \qquad (1)$$

As expressed by the aforementioned formula (1), the higher the frequency f of the sonic wave to be radiated, the shorter the wavelength $\lambda$ of the sonic wave which propagates within the acoustic lens. For example, when the acoustic velocity v is 1,000 m/s, in the case of radiating a sonic wave having a frequency of 10 MHz to the acoustic lens, the wavelength $\lambda$ of the propagating sonic wave becomes 100 µm, and in the case of radiating a sonic wave having a frequency 15 MHz, the wavelength $\lambda$ of the propagating sonic wave becomes 66.7 µm.

That is, the acoustic lens of the present invention exhibits excellent acoustic characteristics as an acoustic lens to be used for propagating a sonic wave having a wavelength $\lambda$ of 100 µm or less, and this means that when used by radiating a sonic wave having a frequency of 10 MHz or more to the acoustic lens, excellent acoustic characteristics are exhibited. In the present invention, by selecting the particle diameter of the silica particles in response to the wavelength $\lambda$ of the sonic wave to be propagated, an acoustic lens having a low attenuation quantity of sonic vibration is obtained. For that reason, though a lower limit of the wavelength $\lambda$ of the sonic wave to be propagated is not particularly limited, it may be, for example, set to 2 µm or more from the viewpoint of resolution enhancement of the frequency in an ultrasound diagnosis with a probe.

The reason why the D90 of the silica particles is prescribed to less than ⅛ of the wavelength $\lambda$ of the propagating sonic wave resides in the matter that when the sonic wave propagates within the acoustic lens, the influence of attenuation (propagation attenuation) of the sonic vibration generated due to irregular reflection of the sonic wave by the silica particles, or the like is allowed to be minimized. That is, by selecting such silica particles, an acoustic lens having a low propagation attenuation quantity is obtained. On the other hand, when the D90 of the silica particles is ⅛ or more of the wavelength 2L of the propagating sonic wave, the influence of scattering of the sonic wave due to the silica particles, or the like increases, and the propagation attenuation quantity becomes high.

As mentioned above, by selecting the particle diameter of the silica particles in response to the frequency of the sonic wave to be radiated, it is not needed to use fine silica particles at random, silica particles having an appropriate particle diameter to an extent such that the acoustic characteristics are not affected can be used, and it becomes possible to design a composition with a high degree of freedom.

A lower limit of the D90 is not particularly limited so long as the average primary particle diameter is restricted to the aforementioned predetermined range. Such D90 is, for example, 16 nm or more.

The average primary particle diameter and D90 of the silica particles in the present invention are considered to be substantially identical to the average primary particle diameter and D90 of silica particles as a raw material as mentioned later.

Though the shape of such silica particles is not particularly limited, examples thereof include a true spherical shape, an ellipsoidal spherical shape, and a crushed shape. The reflection on the particle interface occurs particularly on the vertical plane to the direction of travel of the sonic wave, and therefore, in the particle shape with anisotropy, instability is liable to be generated in the attenuation of sonic vibration. In consequence, a shape which is close to a true sphere as far as possible and has a smooth surface is preferred.

The content of the silica particles is preferably 15 to 100 parts by mass, more preferably 20 to 90 parts by mass, and still more preferably 25 to 80 parts by mass based on 100 parts by mass of the silicone resin. By allowing the content of the silica particles to fall within the aforementioned range, the role as the filler can be satisfactorily exhibited without deteriorating the acoustic characteristics. On the other hand, when the content of the silica particles is less than 15 parts by mass, the acoustic characteristics (in particular, an acoustic impedance) and strength which are considered to be necessary for the acoustic lens are not obtained, whereas when it is more than 100 parts by mass, not only a time is required for kneading, but also there is a tendency that the viscosity of the composition increases, thereby hindering molding.

The total content of the silicone resin and the silica particles is preferably 70% by mass or more, more preferably 80% by mass or more, and still more preferably 90% by mass or more in the acoustic lens, and it may also be 100% by mass. By allowing the total content of the silicone resin and the silica particles to fall within the aforementioned range, an acoustic lens having a strength needed to practical use can be obtained.

(Other Components)

The acoustic lens may further contain other components than those as mentioned above, as the need arises. Examples of other components than those as mentioned above include a colorant, a platinum catalyst, a curing accelerator, a curing retardant, a solvent, a dispersant, an antistatic agent, an antioxidant, a flame retarder, and a thermal conductivity enhancer.

Above all, the colorant is a component which is blended for the purpose of discrimination or confirmation of clean state. Examples of such a colorant include a pigment or a dye, such as carbon and titanium oxide. These components may be used alone or may be used in combination of two or more thereof. Though the content of the colorant is not particularly limited, it is preferably 0.01 to 10 parts by mass, and more preferably 0.01 to 5 parts by mass based on 100 parts by mass of the silicone resin.

(Hardness)

With respect to the acoustic lens of the present invention, the hardness as measured by a type A durometer in conformity with JIS K6253-3:2012 (hereinafter also referred to as "hardness A") is preferably 25 or more, more preferably 28 or more, and still more preferably 30 or more. When the hardness A falls within the aforementioned range, shape retention properties as the acoustic lens become favorable. In particular, from the viewpoint of avoiding deformation on practical use, the hardness A is still more preferably 30 or more. In addition, the hardness A is preferably 50 or less, more preferably 45 or less, and still more preferably 42 or less. When the hardness A falls within the aforementioned range, the acoustic characteristics are kept favorable.

(Density)

The density of the acoustic lens is preferably 1.05 to 1.32 $g/cm^3$, more preferably 1.08 to 1.30 $g/cm^3$, and still more preferably 1.10 to 1.28 $g/cm^3$. When the density falls within the aforementioned range, excellent acoustic characteristics ("acoustic impedance") required for the acoustic lens are revealed, and a favorable acoustic lens is obtained.

In this specification, the density of the acoustic lens means a value measured by the method as described in the section of Examples.

(Acoustic Characteristics)

The acoustic characteristics as the acoustic lens can be, for example, evaluated in terms of an attenuation rate of sonic vibration calculated by the method as described in the section of Examples. In the acoustic lens of the present invention, the attenuation rate is preferably less than 6, and more preferably 5 or less. When the attenuation rate falls within the aforementioned range, the attenuation quantity of sonic vibration which propagates within the acoustic lens can be made low, and therefore, excellent acoustic characteristics as the acoustic lens are exhibited. A specific measurement method of attenuation rate is described in the section of Examples.

[Production Method of Acoustic Lens]

An example of a preferred production method of the acoustic lens of the present invention is hereunder described. It should be construed that the acoustic lens of the present invention is not limited to an acoustic lens obtained by the following production method.

The production method of an acoustic lens of the present invention is preferably a production method of an acoustic lens to be used for propagating a sonic wave having a wavelength λ of 100 μm or less, the method including a step of obtaining a silicone resin composition containing an addition reaction type liquid silicone resin having a viscosity of less than 3.5 Pa·s and silica particles; and a step of curing the silicone resin composition, wherein an average primary particle diameter of the silica particles is 15 nm or more, and a particle diameter (D90) of 90% of a cumulative percentage in cumulative particle size distribution of the silica particles is less than ⅛ of the wavelength λ of the sonic wave to be propagated.

In the following, the production method is described in details.

(Step of Obtaining Silicone Resin Composition)

First of all, the following liquid silicone resin and the silica particles, and optionally, other components are prepared, respectively, and appropriate amounts thereof are weighed in predetermined blending ratios. The weighing can be performed by a known method, and the blending ratios of the respective components conform to the aforementioned content of the acoustic lens.

The liquid silicone resin is preferably an addition reaction type liquid silicone resin having a viscosity of less than 3.5 Pa·s. The addition reaction type liquid silicone resin means a liquid silicone resin which is cured through an addition reaction.

In general, the liquid silicone resin is classified into an addition reaction type and a condensation reaction type depending upon the kind of curing reaction. Here, in the condensation reaction type, there is a case where a gas component (for example, water vapor ($H_2O$) and hydrogen ($H_2$)) is formed at the time of curing reaction. Such a gas component occasionally remains as an air bubble in the liquid silicone resin, and when the liquid silicone resin is cured as it is, there is a concern that a void is formed within the acoustic lens, thereby bring about worsening in acoustic characteristics. For that reason, the liquid silicone resin is desirably one which does not form a gas component in the curing reaction, and from such a viewpoint, an addition reaction type liquid silicone resin is suitable. As for such an addition reaction type liquid silicone resin, for example, a resin containing a silicone component having, as a side chain, hydrogen or a vinyl group, is corresponding thereto.

Though the addition reaction type liquid silicone resin is not particularly limited, known materials can be widely used, and all of experimental synthesis products and commercially available products may be used. In addition, the addition reaction type liquid silicone resin includes a one-pack type and a two-pack mixing type, and all of them can be used.

The viscosity of the addition reaction type liquid silicone resin is preferably less than 3.5 Pa·s, more preferably 2.5 Pa·s or less, and still more preferably 2.0 Pa·s or less at room temperature (22° C.±5° C.). By using a liquid silicone resin having a viscosity falling within the aforementioned range, a silicone resin composition having favorable defoaming properties is obtained, and a void is hardly formed within the acoustic lens.

Examples of the aforementioned commercially available product of addition reaction type liquid silicone resin include "KE-1031 A/B", manufactured by Shin-Etsu Chemical Co., Ltd., "KE-109E A/B", manufactured by the same company, and "KE-103", manufactured by the same company; as well as "EG-3000", manufactured by Dow Corning Toray Co., Ltd., "EG-3100", manufactured by the same company, "EG-3810", manufactured by the same company, "527", manufactured by the same company, and "S 1896FR EG", manufactured by the same company.

The silica particles are not particularly limited so long as they are satisfied with not only the predetermined particle diameter, namely the average primary particle diameter of 15 nm or more, but also the D90 of less than ⅛ of the wavelength λ of the sonic wave to be propagated, and all of experimental synthesis products and commercially available products may be used. Specifically, examples of such silica particles include fused silica, crystalline silica, colloidal silica, silica aerogel, fumed silica, pyrogenic silica, and precipitated silica. Above all, fumed silica, fused silica, and colloidal silica are preferred. In addition, the surface of the silica particle may be subjected to a silane treatment with a linear organopolysiloxane, a cyclic organopolysiloxane, hexamethyldisilazane, or the like. Such silica particles may be used alone or may be used in combination of two or more thereof. Examples of the commercially available product of silica particles include "AEROSIL (registered trademark) RX-50", manufactured by Nippon Aerosil Co., Ltd.

The average primary particle diameter of the silica particles has only to be 15 nm or more, and it is preferably 25 nm or more, and more preferably 30 nm or more. By allowing the average primary particle diameter of the silica particles to fall within the aforementioned range, it is not needed to use excessively fine particles, and the workability at the time of kneading becomes favorable, and in addition thereto, the viscosity of the silicone resin composition can also be appropriately regulated.

The D90 of the silica particles has only to be less than ⅛ of the wavelength λ of the sonic wave to be propagated. Such D90 is, for example, less than 12.5 μm, and preferably 10 μm or less. By allowing the D90 of the silica particles to fall within the aforementioned range, the reflection of the sonic wave on the particle interface can be efficiently suppressed, and an acoustic lens having favorable acoustic characteristics can be fabricated.

The silica particles have only to be one satisfying the aforementioned relation of particle diameter, and they may be a silica powder of a single kind or may be a mixed powder composed of a mixture of two or more kinds of silica powders having a different particle size distribution from each other. In the case where the silica particles are a mixed powder, though the aforementioned relation regarding the particle diameter has only to be satisfied in a state of the mixed powder, it is more preferred that the respective silica powders are each satisfied with the aforementioned relation regarding the particle diameter in a state before mixing. In addition, in the case where two or more kinds of powders are mixed and used, though the respective silica powders may be individually blended in the liquid silicone resin, it is more preferred that the respective silica powders are uniformly mixed in advance and then blended as a mixed powder in the liquid silicone resin.

In this specification, the average primary particle diameter and D90 of the silica particles as the raw material mean values measured by the method as described in the section of Examples.

Examples of other components include a colorant, a platinum catalyst, a curing accelerator, a curing retardant, a solvent, a dispersant, an antistatic agent, an antioxidant, a flame retarder, and a thermal conductivity enhancer. As for all of these materials, known materials can be widely used, and all of experimental synthesis products and commercially available products may be used.

Subsequently, the respective components which have been prepared as mentioned above are mixed to prepare a silicone resin composition. The silicone resin composition which is fabricated by mixing the aforementioned liquid silicone resin having a predetermined viscosity and the silica particles having a predetermined particle diameter is free from an excessive increase of the viscosity and is excellent in workability and moldability.

A mixing method is not particularly limited and can be performed by a known method. Examples of such a mixing method include dispersion and mixing with a roll mill, agitation and mixing with a rotary blade, mixing with a planetary agitation mixer, mixing with a homogenizer, and mixing with a kneader.

(Step of Curing Silicone Resin Composition)

The silicone resin composition as obtained above is molded in a predetermined shape and cured. The thus obtained cured product (acoustic lens) is substantially free from foam (voids) and exhibits excellent acoustic characteristics.

A molding method is not particularly limited and can be performed by a known method. For example, the molding can be performed by a method in which the mixed resin composition is poured into a mold and clamped, followed by curing. In addition, the molding shape is not particularly limited, too, and a desired shape can be realized according to a form of use or the like.

A curing method is not particularly limited, and though it varies with a material system, for example, it is preferred that the curing is performed under the following condition.

A curing temperature is preferably 50 to 150° C., and more preferably 50 to 120° C. By allowing the curing temperature to fall within the aforementioned range, a dimensional precision is readily obtained.

A curing time is preferably 0.5 to 5.0 hours, and more preferably 1.0 to 3.0 hours. By allowing the curing time to fall within the aforementioned range, an acoustic lens having a strength needed to practical use can be obtained.

(Step of Subjecting Silicone Resin Composition to Defoaming Treatment)

It is preferred that the aforementioned production method further includes a step of subjecting the silicone resin composition to a defoaming treatment prior to curing. By applying a defoaming treatment prior to curing, foam can be thoroughly removed from the silicone resin composition prior curing. The cured product (acoustic lens) obtained through subsequent curing is free from foam (voids) and exhibits excellent acoustic characteristics.

Though the defoaming treatment can be performed by a known method, examples thereof include vacuum defoaming and agitation defoaming.

(Other Steps)

The aforementioned production method may further include other steps than those as mentioned above, as the need arises. For the purpose of improving chemical resistance, water resistance, wear resistance, adhesiveness, or the like, it is possible to apply various treatments within a range where the acoustic characteristics are not affected.

[Acoustic Wave Probe]

The acoustic lens of the present invention is suitably used as a constituent member of an acoustic wave probe.

A representative constitution of an acoustic wave probe is shown in FIG. 1 as a diagrammatic perspective view (partial transparent view). An acoustic wave probe 10 shown in FIG. 1 includes an acoustic lens 1, an acoustic matching layer 2, a piezoelectric element (transducer) 3, and a backing material 4 in order from the side of an ultrasonic wave transmitting and receiving surface (object side) and is further equipped with a housing 5 accommodating them therein.

The acoustic wave probe 10 equipped with the acoustic lens 1 of the present invention has a high ultrasonic wave propagation efficiency, and according to this, it becomes possible to undergo an ultrasound diagnosis with a clear image.

While the embodiments of the present invention have been described, it should be construed that the present invention is not limited to the aforementioned embodiments, and all of embodiments included in the concept and the scope of claims of the present invention are included and can be modified in various ways within the scope of the present invention.

EXAMPLES

The present invention is hereunder described in more detail by reference to Examples. However, it should be construed that the present invention is by no means limited to the following Examples.

With respect to Fabrication Examples, Examples, and Comparative Examples as mentioned later, the respective evaluations were performed under the following conditions.

[1] Average Primary Particle Diameter and D90

The average primary particle diameter and D90 of silica particles were measured by using a laser diffraction particle size distribution analyzer (a trade name: LA-500, manufactured by Horiba, Ltd.).

Specifically, silica particles were added in water having a surfactant added thereto and subjected to an ultrasonic treatment to thoroughly disperse the silica particles, and then, this slurry was used as a measurement sample and measured for particle size distribution by using the aforementioned apparatus. In the cumulative particle size distribution of the obtained silica particles, a particle diameter (D50) of 50% of a cumulative percentage was defined as the average primary particle diameter, and a particle diameter of 90% of a cumulative percentage was defined as D90.

With respect to silica particles which could not be subjected to the aforementioned measurement because of aggregation of the particles, an electron microscopic photograph was taken, and the measurement of the particle diameter of the primary particles was performed by means of image analysis. According to this method, based on the particle diameter of the primary particles obtained from the electron microscopic photograph, an average value thereof was defined as the average primary particle diameter, and the particle diameter of 90% of the cumulative percentage based on a particle size distribution curve was defined as D90.

[2] Defoaming

A molded article was observed through visual inspection, to confirm the presence or absence of air bubbles. The case where the air bubbles were not confirmed through visual inspection was evaluated to be favorable in defoaming.

[3] Density

A molded article having a thickness of 2 mm was cut out into a size of 50 mm×50 mm and determined for the density by the water immersion method.

[4] Hardness A

A molded article having a thickness of 2 mm was measured for the hardness A in conformity with JIS K6253-3: 2012.

A type A durometer (a trade name: GS-719N, manufactured by Teclock Co., Ltd.) was used as a hardness meter.

[5] Acoustic Characteristics (Attenuation Rate)

The acoustic characteristics were evaluated by the following method according to the reflection method. The evaluation method is hereunder described while referring to a diagrammatic view shown in FIG. 2.

A molded article having a thickness of 2 mm was used as a measurement sample 1a; as shown in FIG. 2, an ultrasonic wave W0 having a predetermined oscillation frequency was made incident on the sample 1a by using a probe 20; intensities of a first wave W1 and a second wave W2 of a reflected wave as observed were determined; and the attenuation rate was calculated according to the following formula (2).

$$\text{Attenuation rate} = 20 \log(I1/I2)/2t \quad (2)$$

In the formula (2), I1 is an intensity of the first wave W1 of the reflected wave; I2 is an intensity of the second wave W2 of the reflected wave; and t is the thickness of the molded article. As the probe 20, a probe for a 10 MHz oscillation frequency (a trade name: V127-RM/U8403050, manufactured by Olympus Corporation) or a probe for a 15 MHz oscillation frequency (a trade name: V113-RM/U8403036, manufactured by Olympus Corporation) was used.

In this Example, in the case where the attenuation rate of sonic vibration is less than 5.0, the acoustic characteristics were evaluated to be favorable ("A"); in the case where the attenuation rate of sonic vibration is 5.0 or more and less than 6.0, the acoustic characteristics were evaluated to be slightly poor ("B"); and in the case where the attenuation rate of sonic vibration is 6.0 or more, the acoustic characteristics were evaluated to be poor ("C"). When the acoustic characteristics are favorable, it is meant that the measurement sample can be suitably used for an acoustic lens.

Fabrication Example 1: Sample Nos. 1 to 16

An addition type liquid silicone resin (a trade name: KE-1031 A/B, manufactured by Shin-Etsu Chemical Co., Ltd., viscosity at room temperature (22° C.±5° C.): A=1.0 Pa·s, B=0.7 Pa·s) in an amount of 100 parts by mass (A/B=50 parts by mass/50 parts by mass) was blended with an appropriate amount of silica particles and subjected to a kneading treatment, thereby preparing a silicone resin composition. The raw material and blending ratio of the silica particles are shown in Table 1.

Here, Silicas A to F shown in Table 1 are corresponding to the following raw materials, respectively.

Silica A: Powdery silica (average primary particle diameter: 30 nm, D90: 100 nm)
Silica B: Powdery silica (average primary particle diameter: 2.8 μm, D90: 5.1 μm)
Silica C: Powdery silica (average primary particle diameter: 6.0 μm, D90: 11.3 μm)
Silica D: Powdery silica (average primary particle diameter: 9.8 μm, D90: 15.9 μm)
Silica E: Powdery silica (average primary particle diameter: 13.6 μm, D90: 22.1 μm)
Silica F: Powdery silica (average primary particle diameter: 10 nm, D90: 100 nm)

The average primary particle diameter and D90 of each of Silica A and Silica F were each a value on a basis of the particle diameter of the primary particles obtained from the electron microscopic photograph, and the average primary particle diameter and D90 of each of Silicas B to E were each a value measured by a laser diffraction particle size distribution analyzer.

In the case where the silica particles were made of two kinds of raw materials, the two raw materials were previously weighed and mixed to form a uniform mixed powder, which was then blended in the aforementioned liquid silicone resin.

The thus obtained silicone resin composition was subjected to a defoaming treatment and then heated and cured at 80° C. for 2 hours. There were thus fabricated molded articles each having a thickness of 2 mm (Sample Nos. 1 to 16). In addition, the results of the density and the hardness A measured regarding the molded articles are shown in Table 1.

Fabrication Example 2: Sample No. 17

The fabrication of a silicone resin composition was attempted in the same manner as in Fabrication Example 1, except for blending the silica particles in a quantitative relation shown in Table 1. But, since the particle diameter of the blended silica particles was less than 15 nm in terms of the average primary particle diameter, the viscosity of the mixture became excessively high, so that generation of heat took place at the time of mixing operation. Thus, the fabrication of sample was stopped.

TABLE 1

| | Raw Material | Blending amount based on 100 parts by mass of silicone resin [parts by mass] | | | | | | | Evaluation of characteristics | |
|---|---|---|---|---|---|---|---|---|---|---|
| | Average primary | Silica A | Silica B | Silica C | Silica D | Silica E | Silica F | | | |
| Silica particles | particle diameter D90 | 30 nm 100 nm | 2.8 μm 5.1 μm | 6.0 μm 11.3 μm | 9.8 μm 15.9 μm | 13.6 μm 22.1 μm | 10 nm 100 nm | Total content | Density [g/cm³] | Hardness A |
| Sample No. | 1 | 20 | — | — | — | — | — | 20 | 1.08 | 27 |
| | 2 | 35 | — | — | — | — | — | 35 | 1.14 | 32 |
| | 3 | 50 | — | — | — | — | — | 50 | 1.20 | 39 |
| | 4 | 67 | — | — | — | — | — | 67 | 1.26 | 44 |
| | 5 | 20 | 15 | — | — | — | — | 35 | 1.14 | 29 |
| | 6 | 25 | 25 | — | — | — | — | 50 | 1.20 | 36 |
| | 7 | 25 | 42 | — | — | — | — | 67 | 1.26 | 41 |
| | 8 | 20 | — | 15 | — | — | — | 35 | 1.14 | 28 |
| | 9 | 25 | — | 25 | — | — | — | 50 | 1.20 | 33 |
| | 10 | 25 | — | 42 | — | — | — | 67 | 1.26 | 39 |
| | 11 | 20 | — | — | 15 | — | — | 35 | 1.14 | 27 |
| | 12 | 25 | — | — | 25 | — | — | 50 | 1.20 | 33 |
| | 13 | 25 | — | — | 42 | — | — | 67 | 1.26 | 37 |
| | 14 | 25 | — | — | — | 25 | — | 50 | 1.20 | 31 |
| | 15 | 25 | — | — | — | 42 | — | 67 | 1.29 | 36 |
| | 16 | — | — | — | — | — | 50 | 50 | 1.17 | 43 |
| | 17 | — | — | — | — | — | 67 | 67 | — | — |

Examples 1 to 7 and Comparative Examples 1 to 6

Each of the molded articles fabricated in Fabrication Example 1 was used as a measurement sample 1a, and an ultrasonic wave was radiated (inputted) with a probe having an oscillation frequency of 10 MHz, thereby evaluating the acoustic characteristics as an acoustic lens. The Sample No. of the used molded article and the results of acoustic characteristics are shown in Table 2. The wavelength λ of the sonic wave to be propagated within the acoustic lens at the time of radiating the ultrasonic wave having a frequency of 10 MHz is 100 μm when the acoustic velocity ν of the silicone resin is 1,000 m/s.

TABLE 2

|  |  | Sample No. | Acoustic characteristics at oscillation frequency of 10 MHz [attenuation rate] |
|---|---|---|---|
| Example | 1 | 1 | A |
|  | 2 | 2 | A |
|  | 3 | 3 | A |
|  | 4 | 4 | A |
|  | 5 | 8 | A |
|  | 6 | 9 | A |
|  | 7 | 10 | A |
| Comparative Example | 1 | 11 | B |
|  | 2 | 12 | B |
|  | 3 | 13 | C |
|  | 4 | 14 | B |
|  | 5 | 15 | C |
|  | 6 | 16 | C |

As shown in Table 2, the molded articles used in Examples 1 to 7 were a molded article with favorable defoaming properties because the average primary particle diameter of the silica particles was 15 nm or more. In addition, in these molded articles, the D90 of the silica particles is less than ⅛ (12.5 μm) of the wavelength λ of the sonic wave to be propagated, and therefore, these molded articles exhibited excellent acoustic characteristics, and it was confirmed that they can be suitably used for an acoustic lens to be used for propagating a sonic wave having a wavelength λ of 100 μm (radiating the sonic wave having a frequency of 10 MHz).

On the other hand, in the molded articles used in Comparative Examples 1 to 5, the silica powders having D90 of ⅛ (12.5 μm) or more of the wavelength λ of the sonic wave to be propagated are used as the raw material of the silica particles, and therefore, it was confirmed that these molded articles are inferior in the acoustic characteristics as an acoustic lens to be used for propagating a sonic wave having a wavelength λ of 100 μm.

In addition, in the molded article used in Comparative Example 6, the average primary particle diameter of the silica particles was less than 15 nm, and therefore, the viscosity of the silicone resin composition became excessively high, and the defoaming treatment of the molded article was not thoroughly performed, so that this molded article was a molded article with poor defoaming. For that reason, it was confirmed that this molded article is inferior in the acoustic characteristics as an acoustic lens to be used for propagating a sonic wave having a wavelength λ, of 100 μm.

Examples 8 to 14 and Comparative Examples 7 to 12

Each of the molded articles fabricated in Fabrication Example 1 was used as a measurement sample 1a, and an ultrasonic wave was radiated (inputted) with a probe having an oscillation frequency of 15 MHz, thereby evaluating the acoustic characteristics as an acoustic lens. The Sample No. of the used molded article and the results of acoustic characteristics are shown in Table 3. The wavelength λ of the sonic wave to be propagated within the acoustic lens at the time of radiating the ultrasonic wave having a frequency of 15 MHz is 66.7 μm when the acoustic velocity ν of the silicone resin is 1,000 m/s.

TABLE 3

|  |  | Sample No. | Acoustic characteristics at oscillation frequency of 15 MHz [attenuation rate] |
|---|---|---|---|
| Example | 8 | 1 | A |
|  | 9 | 2 | A |
|  | 10 | 3 | A |
|  | 11 | 4 | A |
|  | 12 | 5 | A |
|  | 13 | 6 | A |
|  | 14 | 7 | A |
| Comparative Example | 7 | 8 | B |
|  | 8 | 9 | C |
|  | 9 | 10 | C |
|  | 10 | 12 | C |
|  | 11 | 13 | C |
|  | 12 | 16 | C |

As shown in Table 3, the molded articles used in Examples 8 to 14 were a molded article with favorable defoaming properties because the average primary particle diameter of the silica particles was 15 nm or more. In addition, in these molded articles, the D90 of the silica particles is less than ⅛ (8.3 μm) of the wavelength λ of the sonic wave to be propagated, and therefore, these molded articles exhibited excellent acoustic characteristics, and it was confirmed that they can be suitably used for an acoustic lens to be used for propagating a sonic wave having a wavelength λ of 66.7 μm (radiating the sonic wave having a frequency of 15 MHz).

On the other hand, in the molded articles used in Comparative Examples 7 to 11, the silica powders having D90 of ⅛ (8.3 μm) or more of the wavelength λ of the sonic wave to be propagated are used as the raw material of the silica particles, and therefore, it was confirmed that these molded articles are inferior in the acoustic characteristics as an acoustic lens to be used for propagating a sonic wave having a wavelength λ of 66.7 μm.

In addition, in the molded article used in Comparative Example 12, the average primary particle diameter of the silica particles was less than 15 nm, and therefore, the viscosity of the silicone resin composition became excessively high, and the defoaming treatment of the molded article was not thoroughly performed, so that this molded article was a molded article with poor defoaming. For that reason, it was confirmed that this molded article is inferior in the acoustic characteristics as an acoustic lens to be used for propagating a sonic wave having a wavelength λ of 66.7 μm.

As is noted from comparison between the Examples and the Comparative Examples, in accordance with the present invention, by selecting the particle diameter of the silica particles in response to the wavelength λ of the sonic wave to be propagated, it is possible to provide an acoustic lens having excellent acoustic characteristics efficiently and relatively simply. Such an acoustic lens is suitable as an acoustic

REFERENCE SIGNS LIST

1: Acoustic lens
1a: Measurement sample
2: Acoustic matching layer
3: Piezoelectric element
4: Backing material
5: Housing
10: Acoustic wave probe
20: Probe

The invention claimed is:

1. An acoustic lens to be used for propagating a sonic wave having a wavelength $\lambda$ of 100 µm or less, wherein
   the acoustic lens comprises a silicone resin and silica particles,
   an average primary particle diameter of the silica particles is 15 nm or more, and
   a particle diameter (D90) of 90% of a cumulative percentage in cumulative particle size distribution of the silica particles is less than 1/8 of the wavelength $\lambda$ of the sonic wave to be propagated.

2. The acoustic lens according to claim 1, which has a hardness, as measured by a type A durometer in conformity with JIS K6253-3:2012, of 30 or more and 50 or less.

3. An acoustic wave probe comprising the acoustic lens according to claim 1.

4. A production method of an acoustic lens to be used for propagating a sonic wave having a wavelength $\lambda$ of 100 µm or less, the method comprising
   a step of obtaining a silicone resin composition containing an addition reaction type liquid silicone resin having a viscosity of less than 3.5 Pa·s and silica particles; and
   a step of curing the silicone resin composition, wherein
   an average primary particle diameter of the silica particles is 15 nm or more, and
   a particle diameter (D90) of 90% of a cumulative percentage in cumulative particle size distribution of the silica particles is less than 1/8 of the wavelength $\lambda$ of the sonic wave to be propagated.

5. The production method of an acoustic lens according to claim 4, further comprising a step of subjecting the silicone resin composition to a defoaming treatment prior to curing.

* * * * *